United States Patent [19]
Sugibayashi

[11] Patent Number: 6,075,735
[45] Date of Patent: Jun. 13, 2000

[54] SEMICONDUCTOR MEMORY DEVICE HAVING REVERSING LOGIC MEANS

[75] Inventor: Tadahiko Sugibayashi, Tokyo, Japan

[73] Assignee: NEC Corporation, Tokyo, Japan

[21] Appl. No.: 09/164,368

[22] Filed: Oct. 1, 1998

[30] Foreign Application Priority Data

Oct. 1, 1997 [JP] Japan ................................. 9-268266

[51] Int. Cl.[7] .................................................. G11C 7/02
[52] U.S. Cl. ................................... 365/206; 365/189.11
[58] Field of Search .................................. 365/206, 220,
365/189.05, 189.12, 189.11, 203; 371/30;
341/67

[56] References Cited

U.S. PATENT DOCUMENTS

| 4,744,085 | 5/1988 | Fukatsu | 371/30 |
| 5,055,841 | 10/1991 | Cordell | 341/67 |
| 5,625,601 | 4/1997 | Gillingham et al. | 365/220 |

FOREIGN PATENT DOCUMENTS 9-82086  3/1997  Japan .

*Primary Examiner*—David Nelms
*Assistant Examiner*—David Lam
*Attorney, Agent, or Firm*—Sughrue, Mion, Zinn, Macpeak & Seas, PLLC

[57] ABSTRACT

A DRAM having open-bit-lines wherein noise to be impressed to word-lines can be restricted within a certain range. The DRAM includes a logic reversing circuit for reversing the logic levels of a portion of bits in a bit sequence to be stored, and a circuit for recording and detecting whether the logic levels of the portion of the bits is reversed for each stored bit sequences. Logic reversal takes place when one logic level predominates the bits of the bit sequence. Examples of the portion of bits in a bit sequence subject to logic level reversal would be the odd-numbered bits or even-numbered bits in a sequence.

17 Claims, 6 Drawing Sheets

FIG.2A

|  | 1 | 2 | 3 | 4 | 5 | 6 | 7 | 8 | 9 | 10 | ··· | 16 |
|---|---|---|---|---|---|---|---|---|---|---|---|---|
| INPUT DATA | 0→ | 0→ | 1→ | 0→ | 0→ | 0→ | 0→ | 0→ | 0→ | 0→ | ··· | →0 |

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA LATCHED IN DALs 5 | 0 | 0 | 1 | 0 | 0 | 0 | 0 | 0 | 0 | 0 | 0 | 0 | 0 | 0 | 0 | 1 |
| DATA TRANSFERRED TO MSAs 6 | 1 | 0 | 0 | 0 | 1 | 0 | 1 | 0 | 1 | 0 | 1 | 0 | 1 | 0 | 1 | 0 |

REVERSION RECORDING FLAG(DAL 13, MSA 14)

FIG.2B

|  | 1 | 2 | 3 | 4 | 5 | 6 | 7 | 8 | 9 | 10 | 11 | · | 16 |
|---|---|---|---|---|---|---|---|---|---|---|---|---|---|
| INPUT DATA | 0→ | 0→ | 0→ | 1→ | 0→ | 1→ | 0→ | 1→ | 1→ | 0→ | 1→ | · | →0 |

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA LATCHED IN DALs 5 | 0 | 0 | 0 | 1 | 0 | 1 | 0 | 1 | 1 | 0 | 1 | 0 | 0 | 0 | 0 | 0 |
| DATA TRANSFERRED TO MSAs 6 | 0 | 0 | 0 | 1 | 0 | 1 | 0 | 1 | 1 | 0 | 1 | 0 | 0 | 0 | 0 | 0 |

REVERSION RECORDING FLAG(DAL 13, MSA 14)

SEMICONDUCTOR MEMORY DEVICE HAVING REVERSING LOGIC MEANS

BACKGROUND OF THE INVENTION

The present invention relates to a semiconductor memory device having open-bit-lines, and particularly to the semiconductor memory device wherein a sufficient operational margin can be retained even when the logic of a bit sequence to be written is shifted to one side.

As a large capacity semiconductor memory device to be used for storing serial data, such as file data, for example, there is known a DRAM (Dynamic Random-Access-Memory) having open-bit-lines.

A prior art of a DRAM of this type is disclosed in a Japanese patent application laid open as a Provisional Publication No. 82086/'97.

FIG. 8 is a block diagram schematically illustrating a configuration of the DRAM according to the prior art.

In the DRAM of FIG. 8, charge of a memory cell 8 selected by a word-line is transferred through a bit-line to a sub-sense-amplifier (hereinafter abbreviated as the SSA) 7, which is shared by four pairs of bit-lines to be connected to the SSA 7 in turn, and amplified to be sensed by a main sense-amplifier (hereinafter abbreviated as the MSA) 6 connected to the SSA 7 with a pair of main bit-lines. The sensed logic of the MSA 6 is latched by a data-latch (hereinafter abbreviated as the DAL) 5.

Thus, data written in a memory cell connected to one of the four pairs of bit-lines of each SSA is latched by each of a number (16, for example) of DALs ranged in columns, selected by a word-line.

The data latched in the DALs are selected in turn by each multiplexer (hereinafter abbreviated as the MUX) 4 controlled by a selection signal YSW and supplied serially to a read-amplifier (hereinafter abbreviated as the RAMP) 3 to be output through a read/write bus (hereinafter abbreviated as the RW bus) 2 and an in/out buffer 100. While the data latched in the DALs are read out serially, data written in memory cells each connected to a next of the four pairs of bit-lines of each SSA are sensed by MSAs to be latched next by the DALs.

By repeating these processes four times by changing the pair of bit-lines to be connected to each SSA, data written in the 64 memory cells, for example, selected by a word-line are read out divided into four sub-cycles, 16 bits per sub-cycle.

When serial data are written in the DRAM, the serial data supplied to the in/out buffer 100 is amplified by a write-amplifier (hereinafter abbreviated as the WAMP) 2 and latched by each of the DALs serially in turn selected by each MUX controlled by the selection signal YSW. After the logic of each bit of the serial data is latched by each of the DALs, it is transferred to each of the MSAs in parallel. The MSA 6 charges a memory cell connected to one of the four pairs of bit-lines through the SSA 7 and selected by a word-line.

By repeating the above processes four times by changing the pair of bit-lines to be connected to each SSA, serial data of 64 bits, for example, are written in 64 memory cells selected by a word-line, 16 bits at a, divided into four sub-cycles.

The open-bit-line DRAM, wherein memory cells are provided for every cross point of the bit-lines and the word-lines, is advantageous for configuring a large scale memory device. However, a demerit of the open-bit-line DRAM is that charges of memory cells easily leak because of noise impressed to word-lines through parasitic capacitances between word-lines and bit-lines, when the logic of a bit sequence to be written is shifted to one side, to '0' or '1', resulting in decrease of the operational margin necessary for refreshing the memory cells, for example.

For example, in DRAM where each pair of open-bit-lines is used complementarily, potential of either side of the open-bit-lines becomes all HIGH when logic of all bits to be written is either '0' or '1'. Therefore, the potential of inactivated word-lines of the side may be raised near threshold voltage of memory cell MOS transistors through parasitic capacitances such as CP0, CP1, . . . illustrated in FIG. 7, causing leakage of charges of the bit-lines to memory cell capacitors through the memory cell MOS transistors.

When writing or refreshing of the memory cells selected by a word-line is performed divided in four sub-cycles, in such a way as performed in the prior art above described, the noise impressed to the word-lines can be reduced into ¼, the number of activated bitlines being ¼. However, there are cases where a ¼ noise reduction may not be sufficient for retaining a necessary operational margin in DRAMs of large memory capacity. By dividing the writing operation into further sub-cycles, the noise to the word lines may be more reduced. However, the number of access times increases according to number of sub-cycles, resulting in an increase of total cycle time required for writing or refreshing a certain number of memory cells.

SUMMARY OF THE INVENTION

Therefore, a primary object of the present invention is to provide a DRAM having open-bit-lines wherein noise impressed to word-lines can be restricted within a certain range for retaining a necessary operational margin even when the logic of a bit-sequence to be written is shifted to one side. Another object of the invention is to provide a DRAM having open-bit-lines wherein current consumption can be reduced.

In order to achieve the object, a semiconductor device of the invention comprises:

a logic reversing the means for reversing logic of a fixed part of each of bit sequences when logical balance of the bit sequences is shifted to one side, each of the bit sequences having a fixed number of bits to be written at once in memory cells selected by a word-line of the semiconductor memory; and a reversion recording means for recording whether logic of the fixed part is reversed or not for each of the bit sequences.

The logical balance is determined to be shifted to one side when a ratio of bits having majority logic level in each of the bit-sequences is larger than ¾, and logic of the odd-numbered bits, for example, is reversed when the logical balance is shifted. Therefore, the ratio of the bits having the majority logic level to the bits to be written in the memory cells at once can be restricted smaller than ¾, and the noise impressed to word-lines through parasitic capacitances between bit-lines can be reduced.

Further, the average potential of the bit-lines used for data writing can be restricted between a certain range around the pre-charge voltage of the bit-lines. Therefore, potential of one side of pairs of open-bit-lines may be left at a pre-charged potential for economizing current consumption, when data are written in memory cells connected to the other side of the pairs of open-bit-lines, without so increasing the pre-charge time, by short-circuiting the bit-lines transversally after the data writing.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings:

FIG. 2A is a schematic diagram illustrating a case where the data reversal signal REV of FIG. 1 is enabled;

FIG. 2B is a schematic diagram illustrating another case where the data reversal signal REV remains disabled;

DETAILED DESCRIPTION OF THE PREFERRED EMBODIMENTS

Now, embodiments of the present invention will be described in connection with the drawings.

Figure 1:
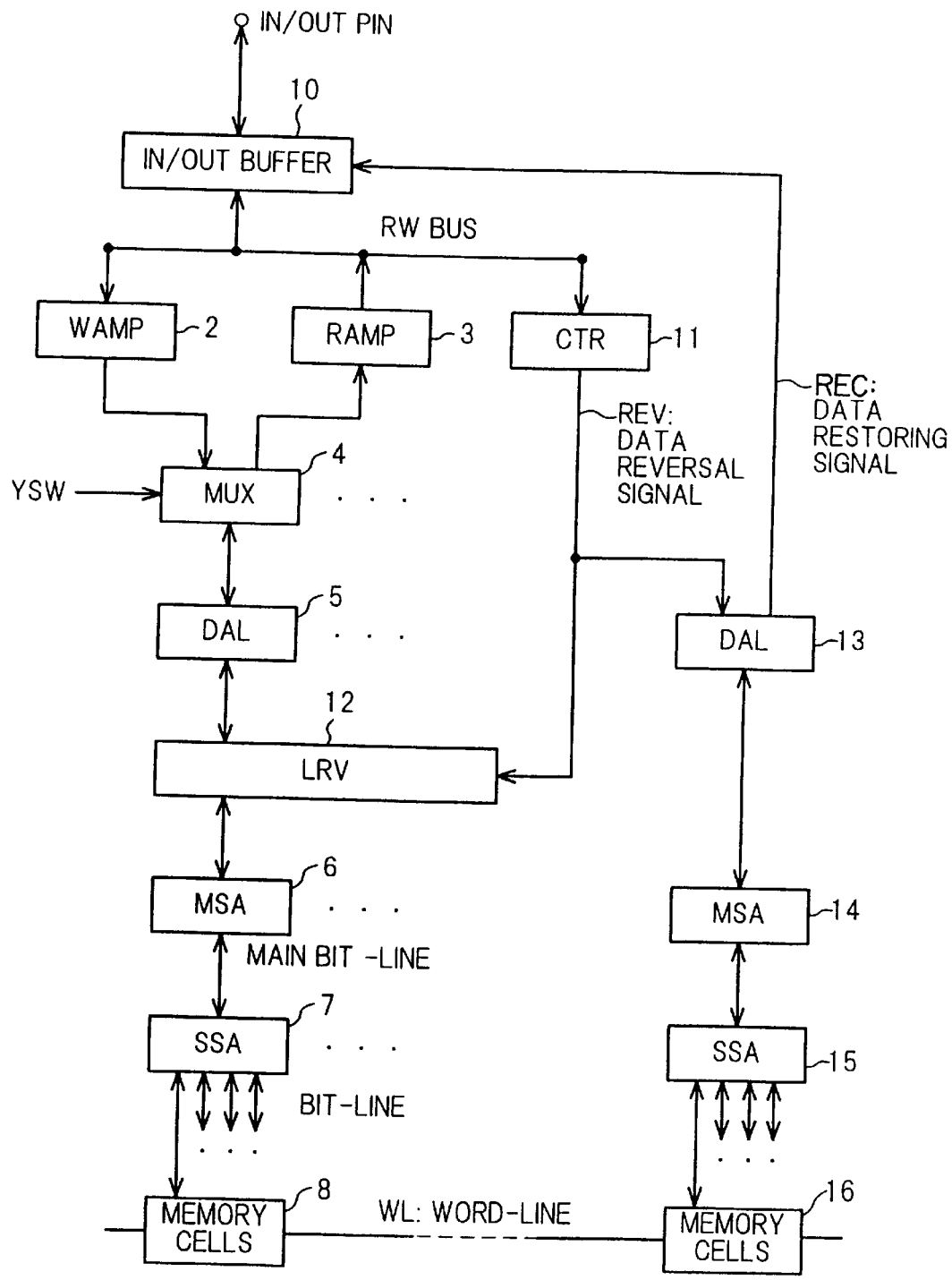
FIG. 1 is a functional block diagram illustrating partial configuration of a DRAM according to the embodiment.

FIG. 1 is a functional block diagram illustrating partial configuration of a DRAM according to the embodiment.

Figure 8:
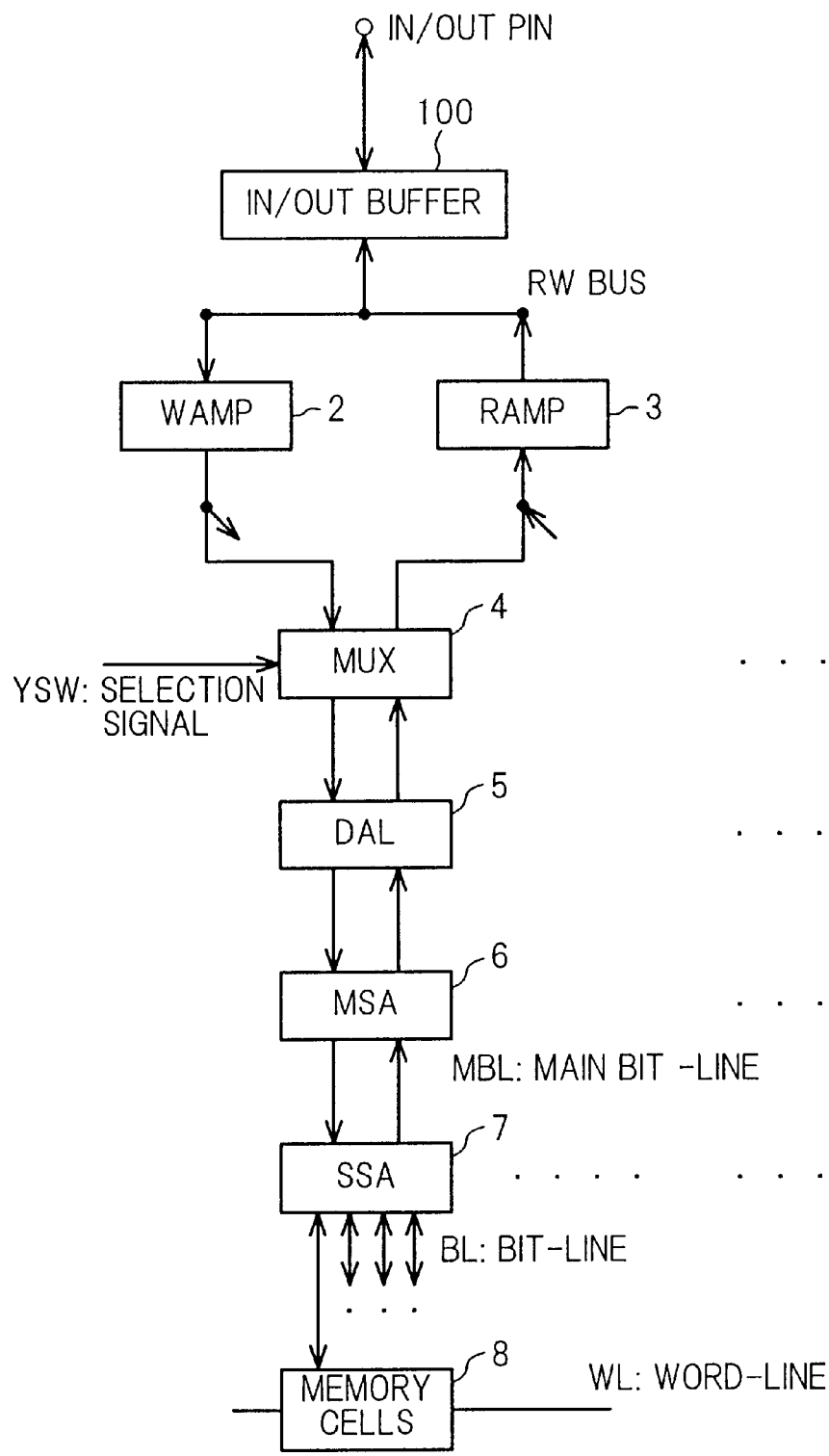
FIG. 8 is a block diagram schematically illustrating a configuration of the DRAM according to a prior art.

Similarly to the DRAM of FIG. 8, the DRAM of FIG. 1 has an in/out buffer 10, a WAMP 2 and a RAMP 3 connected to the in/out buffer 10 through a RW bus, and a number (16, for example) of MSA sets ranged in columns and each connected serially in turn with each other to either the WAMP 2 or the RAMP 3 being selected by a MUX 4 which is controlled by a selection signal YSW. Each of the MSA sets comprises the MUX 4, a DAL 5, a MSA 6, a SSA 7 and memory cells 8 connected to one of four pairs of bit-lines sharing the SSA 7.

Differently from the DRAM of FIG. 8, the in/out buffer 10 of FIG. 1 has a function for restoring the output data when a data restoring signal REC is enabled, and in addition to the configuration of FIG. 8, the DRAM of FIG. 1 further comprise;

a counter (hereinafter abbreviated as the CTR) 11 connected to the RW bus, a logic reversing means (hereinafter abbreviated as the LRV) 12 commonly provided for the number of MSA sets and connected between the DAL 5 and the MSA 6 of each of the MSA sets, and a reversal recording means consisting of an additional MSA set comprising a DAL 13, a MSA 14, a SSA 15 and memory cells 16 connected to one of four pairs of bit-lines sharing the SSA 15.

In the following paragraphs, the DRAM of the embodiment is described assuming to have 16 MSA sets, a first to 16-th MSA set, together with an additional MSA set.

Logic of each bit of data supplied to the in/out buffer 10 and amplified by the WAMP 2 is latched bit by bit by each of the DALs 5 selected sequentially in turn with each of the MUXs 4 according to the selection signal YSW. Thus a bit sequence of 16 bits is converted into parallel data.

The bit sequence of 16 bits is also supplied to the CTR 11 connected to the RW bus. The CTR 11 counts a number n of bits having the same logic, logic '1', for example, in the bit sequence, and when the number n is not more than 3, or more than 12. That is, when n<N/4 or n>3N/4, the CTR 11 enables the data reversal signal REV, N being the number of MSA sets, or the bit width of the bit sequence to be written in one sub-cycle.

The data reversal signal REV is supplied to the LRV 12 and the DAL 13. When the data reversal signal REV is enabled, the LRV 12 reverses the logic of every odd-numbered bit of the bit-sequence latched by the DALs 5 to be transferred to the MSAs 6, that is, the logic of the DALs 5 of the first, the third, . . . , 15-th MSA set, as will be described afterwards referring to FIG. 4. Therefore, the ratio of bits having the same logic to be written in memory cells 8 at once can be restricted to be smaller than 3N/4, that is, not more than 11/16, in the embodiment.

The DAL 13 of the additional MSA set transfers a bit having logic '1' as a reversion recording flag to the MSA 14, when the data reversal signal REV is enabled.

Then, the reversed bit sequence and the reversion recording flag are written in the memory cells 8 and the memory cell 16 selected by a word-line, through the SSAs 7 and 15 and pairs of bit-lines each connected to the SSAs 7 and 15, respectively.

Now, reversion of the bit sequence performed by the LRV 12 is described referring to FIGS. 2A and 2B.

FIG. 2A is a schematic diagram illustrating the case where the data reversal signal REV is enabled, while in FIG. 2B, the data reversal signal REV remains disabled.

In the input data of FIG. 2A, only the third bit has logic '1' and the other 15 bits have logic '0'. The CTR 11 counts the number n of bits having logic '1'. The number n being not more than 3, the CTR, 11 enables the data reversal signal REV. Receiving the data reversal signal REV, the LRV 12 transfers data latched in the DALs 5 to the MSAs 6 by reversing logic of the odd-numbered bits of the data latched in DALs 5. Therefore, seven odd-numbered bits of the data except for the third bit are turned to logic '1', as shown in FIG. 2A, in the MSAs 6. At the same time, the reversion recording flag of logic '1' is transferred to the MSA 14 to be written through the SSA 15.

On the other hand, there are 5 bits having logic '1' in the input data of FIG. 2B. The number n of bits having the same logic being from 4 to 12, the CTR 11 disables the data reversal signal REV. Therefore, the input data latched in the DALs 5 are transferred to the MSAs 6 as they are, and the reversion recording flag of logic '0' is transferred to the MSA 14, which are written in the memory cells 8 and the memory cell 16, respectively.

When the data are read out from the memory cells, the data written in the memory cells 8 are sensed by the MSAs 6 and latched by the DALs 5 as they are through the LRV 12, and transferred serially to the RAMP 3 selected by each of the MUXs 4 in turn.

At the same time, the reversion recording flag written in the memory cell 16 is sensed by the MSA 14 and latched by the DAL 13. When the reversion recording flag has logic '1', the DAL 13 enables the data restoring signal REC. The data restoring signal REC is delivered to the in/out buffer 10. The in/out buffer 10 restores logic of the data read out from the memory cells 8 by reversing logic of odd-numbered bits of the data, when the data restoring signal REC is enabled, as will be described afterwards referring to FIG. 5.

Figure 3A:
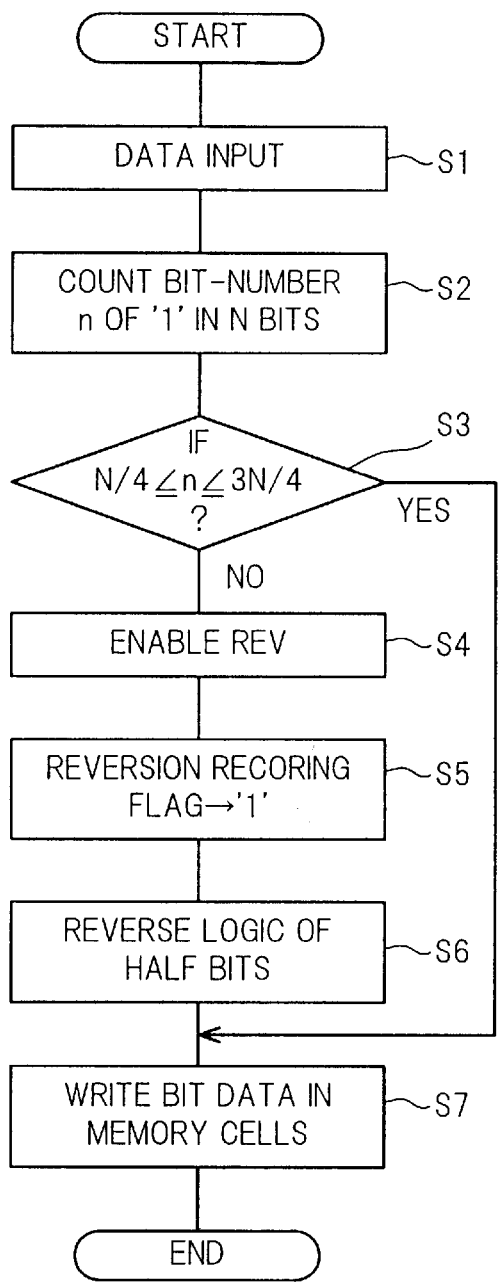
FIG. 3A is a flowchart illustrating data writing of the DRAM of FIG. 1.
Figure 3B:
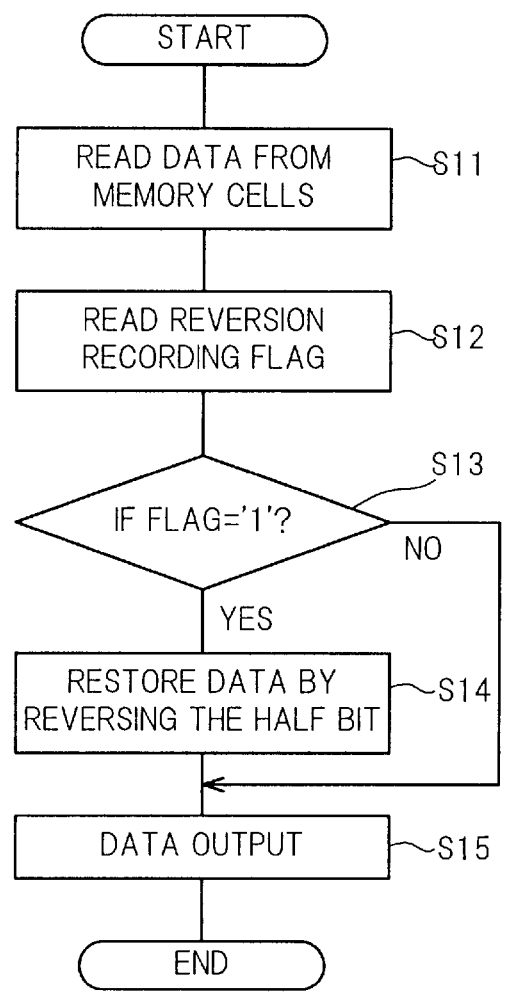
FIG. 3B is a flowchart illustrating data reading of the DRAM of FIG. 1.

Now, operational steps of the data writing and the data reading of the DRAM of FIG. 1 is described referring to flowcharts of FIGS. 3A and 3B.

When input data are to be written, the input data supplied to the in/out buffer 10 are delivered through the RW bus to the WAMP 2 and the CTR 11 (at step S1). The CTR 11 counts the number n of bits having the same logic, '1', for example (at step S2). When the number n is found (at step S3) not more than 3 (n<N/4) or more than 12 (n>3N/4), the data reversal signal REV is enabled (at step S4).

Receiving the enabled data reversal signal REV, the DAL 13 sets the reversion recording flag to logic '1' (at step S5), which is transferred to the MSA 14.

The data delivered to the WAMP 2 at step 1 are amplified and latched in the DALs 5 selected serially in turn by the MUXs 4. When the data reversal signal REV is enabled, the LRV 12 transfers the data latched in the DALs 5 to the MSAs 6 by reversing logic of half bit (odd-numbered bits, as illustrated in FIG. 2A, for example) of the data (at step S6).

The data transferred to the MSAs 6 and the MSA 14 are then written in the memory cells 8 and the memory cell 16 through the SSAs 7 and the SSA 15, respectively (at step S7).

When the number n of bits having the same logic is found to be N/4≦n≦3N/4 at step S3, the data reversal signal REV is disabled and the data latched in the DALs 5 are transferred as they are to the MSAs 6 to be written in the memory cells 8 at step S7, together with the reversion recording flag of logic '0' transferred to the MSA 14 to be written in the memory cell 16.

A When the data written in the memory cells 8 selected by a word line are read out (at step S11) through the SSAs 7 to be latched by DALs 5, the reversion recording flag is read out at the same time through the SSA 15 to be latched by the DAL 13 from the memory cell 16 selected by the same word-line (at step S12).

When the reversion recording flag is found to have logic '1' (at step S13), the DAL 13 enables the data restoring signal REC for controlling the in/out buffer 10. Receiving the enabled data restoring signal REC, the in/out buffer 10 restores (at step S14) the data which are serially transferred through the RAMP 3 selected in turn with the MUXs 4 from the DALs 5, by reversing logic of the half bits (odd-numbered bits, in the example) of the data to be output (at step S15).

When the reversion recording flag is found to have logic '0' (at step S13), the data restoring signal REC is left disabled and the in/out buffer 10 outputs the data delivered from the RAMP as they are (at step S15).

Figure 4:
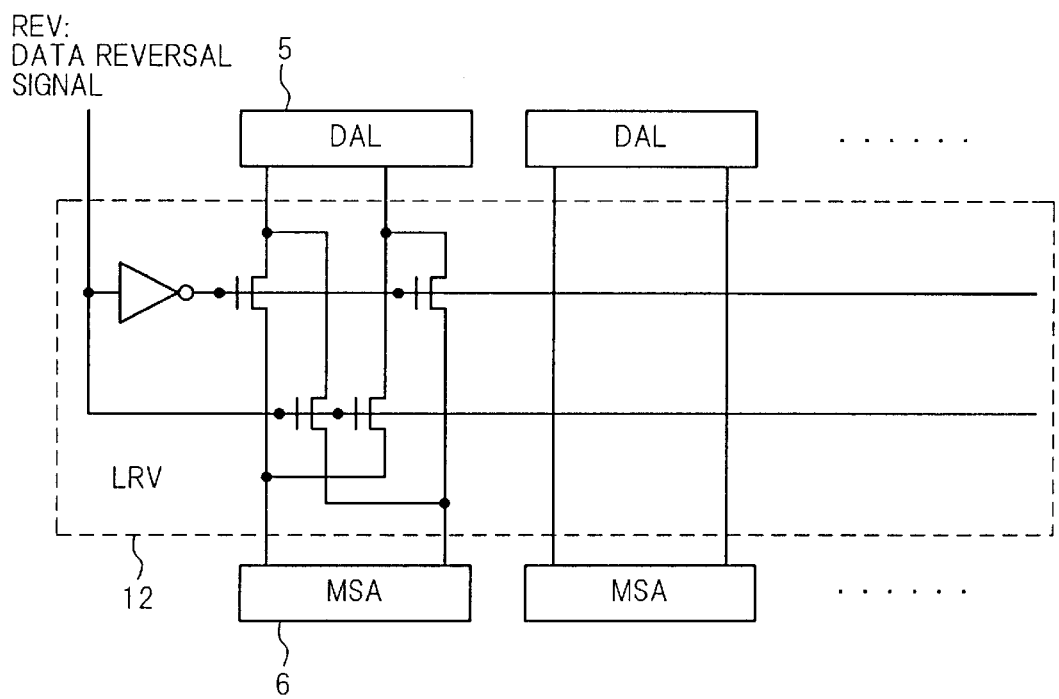
FIG. 4 is a circuit diagram illustrating a concrete example of the LRV 12 of FIG. 1.

Now, the LRV 12 is described referring to a concrete example of a circuit configuration of FIG. 4.

As shown in FIG. 4, complementary outputs of the DALs 5 of the even-numbered MSA sets are connected directly to complementary inputs of the MSAs 6. On the other hand, the complementary outputs of the DALs 5 of the odd-numbered MSA sets are connected to the complementary inputs of the MSAs 6 through two MOS transistors controlled by inverse logic of the data reversal signal REV, and cross-connected to the complementary inputs of the MSAs 6 through two MOS transistors controlled by logic of the data reversal signal REV. Thus, logic of the odd-numbered bits is reversed by the LRV 12 when the data reversal signal REV is enabled.

Figure 5:
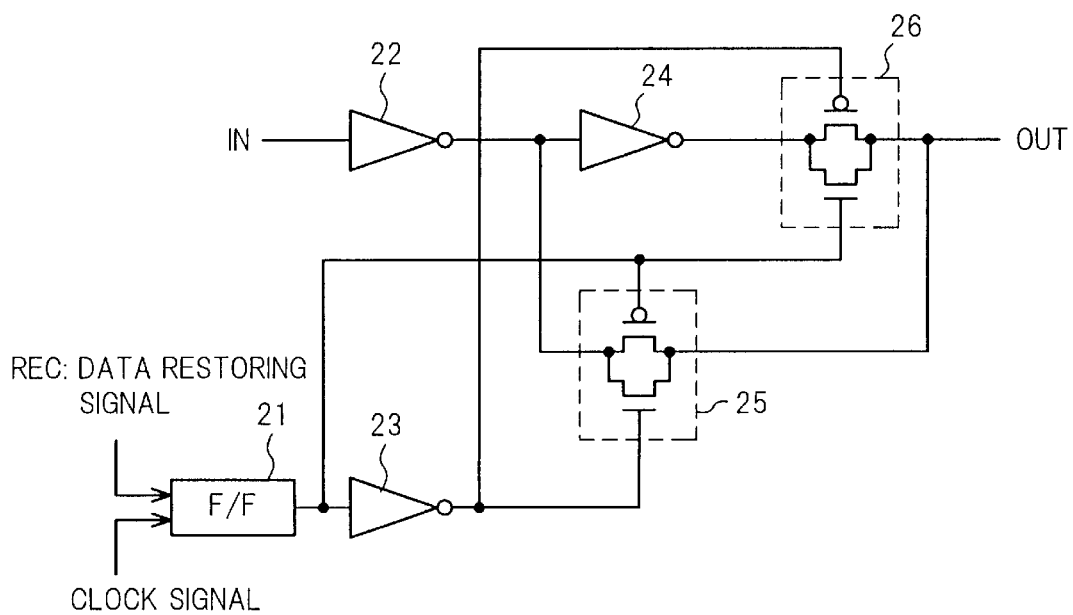
FIG. 5 is a circuit diagram illustrating an example of a concrete circuit configuration of a data restoring means provided the in/out buffer 10 of FIG. 1.

FIG. 5 is a circuit diagram illustrating an example of a concrete circuit configuration of a data restoring means provided the in/out buffer 10.

The serial data from the RAMP 3 supplied in synchronization with a clock signal to an input terminal IN is inverted by an inverter 22 and connected to all output terminal OUT through a first transfer gate 25. The output of the inverter 22 is again inverted by an inverter 24 and connected to the output terminal OUT through a second transfer gate 26.

A flip-flop 21 is supplied with the clock signal and the data restoring signal REC, and outputs a gate control signal having ½ frequency of the clock signal when the data restoring signal REC is enabled. The first and the second transfer gate 25 and 26 become ON in turn controlled by the gate control signal and an inverse gate control signal obtained through an inverter 23. Thus, logic of the odd-numbered bits of the data supplied from the RAMP 3 is reversed when the data restoring signal REC is enabled. When the data restoring signal REC is disabled, the flip-flop 21 maintains the gate control signal at LOW level for controlling only the second transfer gate 26 to be ON.

Thus, the data restoring is performed by the in/out buffer 10 when the reversion recording flag is '1'.

Instead of reversing logic of odd-numbered bits as above described, logic of even-numbered bits may be reversed, of course.

As heretofore described, the ratio of bits having the same logic to be written by MSAs 6 can be restricted to be smaller than ¾ according to the embodiments, which means the the ratio of bit-lines to be charged at HIGH level (at writing voltage Vcc) can be restricted under (3N/4+1)/(N+1), including the bit-line for the reversion recording flag, in either side of the open-bit-lines, reducing the noise to be impressed to the unselected word-lines through parasitic capacitances between the bit-lines.

Heretofore, the invention is described in connection with the embodiment of FIG. 1, wherein each of the 16 MSA sets has an SSA shared by four pair of open-bit-lines, and the data of 64 bits are read and written divided in four sub-cycles in the same way with the prior art DRAM of FIG. 8.

However, the scope of the invention is not limited in the embodiment. When the operational margin is not so severe, a bit-sequence of 64 bits may be written at once in 64 memory cells each directly connected to each of 64 MSAs, for example.

According to the prior art DRAM of FIG. 8, average potential Va of either side of the open-bit-lines is restricted as Va≦⅝Vcc=(16Vcc+48×½Vcc), ½Vcc being pre-charge voltage, by dividing the read/write operation into four sub-cycles.

According to the invention, the average potential Va can be restricted as Va<49/65, giving substantially the same noise reduction with the prior art of FIG. 8, even when the 64 bits are read or written at once without being divided into sub-cycles.

Furthermore, each pair of the open-bit-lines is heretofore described to be used complementarily for writing to a memory cell that is connected to either side of the pair of open-bit-lines, which is advantageous for initializing the potential of the bit-lines to the pre-charge voltage at high-speed by short-circuiting the bit-lines of the pair after writing the memory cell. However, this writing method needs unnecessary current consumption for charging the bit-lines on the side where no memory cell is selected by any word-line.

However, in the DRAM according to the invention, only open-bit-lines of one side, where memory cells selected by a word-line are connected, may be charged without so degrading the operational speed.

Figure 6:
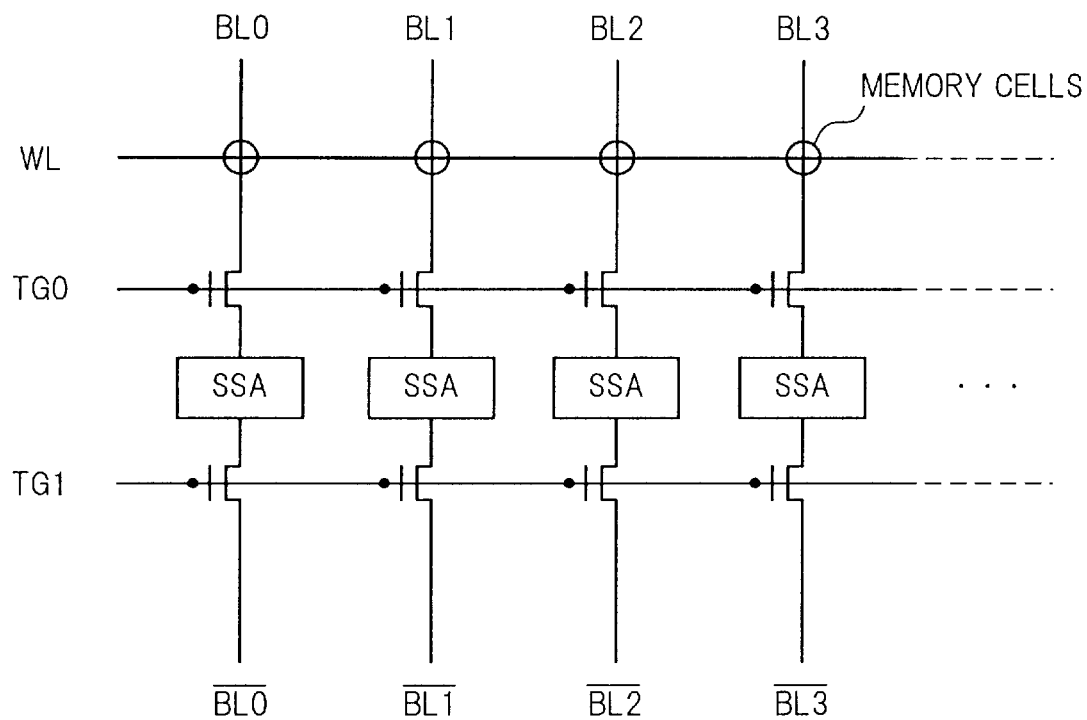
FIG. 6 is a schematic diagram illustrating a partial configuration of a second embodiment of the invention.
Figure 7:
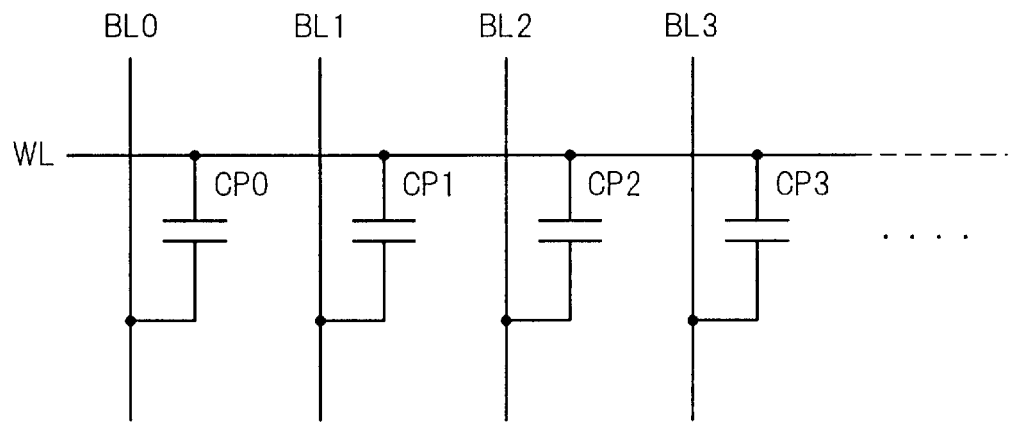
FIG. 7 illustrates parasitic capacitances CP0, CP1, . . . between a word-line and bit-lines.

FIG. 6 is a schematic diagram illustrating a partial configuration of a second embodiment of the invention.

In the embodiment of FIG. 6, bit-lines BL0, BL1, . . . of one side of pairs of open bit-lines are connected to SSAs through transfer gates controlled by a transfer gate signal TG0 and complementary bit lines $\overline{BL0}$, $\overline{BL1}$, . . . of the other side of the pairs of open bit-lines are connected to the SSAs through transfer gates controlled by another transfer gate signal TG1.

When data are written in memory cells, bit-lines of either side whereof memory cells are not selected by the word-line are cut from the SSAs for economizing charging current, and charged bit-lines are short-circuited transversally with each other after writing the memory cells.

The average voltage of the bit-lines for writing the memory cells are restricted between $N/\{4(N+1)\}Vcc$ to $(3N/4+1)/(N+1)Vcc$ as above described. Therefore, operational time for pre-charging bit-lines can be reduced by short-circuiting the bit-lines transversally before pre-charging with the pre-charge voltage of ½Vcc, even if the pairs of open-bit-lines are not used complementarily, enabling to economize current consumption.

What is claimed is:

1. A semiconductor memory device having open-bit-lines; comprising:
    a logic reversing means for reversing logic levels of a portion of bits in a bit sequence when a logical balance of the bit sequence is shifted to one side because one logic level predominates bits of said bit sequence, wherein the bit sequence is composed of a plurality of bits to be written into memory cells selected by a word-line of the semiconductor memory; and
    a reversion recording means for recording whether logic levels of a portion of bits in the bit sequence is reversed.

2. A semiconductor memory device as recited in claim 1; wherein charge potential of one side of a pair of open-bit-lines is left at a pre-charged potential when data is written in a memory cell connected to the other side of said pair of open-bit-lines.

3. A semiconductor memory device as recited in claim 1; wherein the logical balance is determined to be shifted to one side when more than ¾ of bits in the bit sequence have the same logic level.

4. A semiconductor memory device as recited in claim 1; wherein the logical balance is discriminated to be shifted to one side by counting a number of bits having one of logic '1' and logic '0' in each of the bit-sequences.

5. A semiconductor memory device as recited in claim 1, said portion of bits in the bit sequence being odd-numbered bits.

6. A semiconductor memory device as recited in claim 1, said portion of bits in the bit sequence being even-numbered bits.

7. A semiconductor memory device as recited in claim 1; further comprising:
    a reversion detecting means for detecting whether logic levels of a portion of bits in a bit sequence is reversed when said bit sequence is read from memory; and
    a restoring means for restoring logic levels of said portion of bits in said bit sequence read from memory by reversing logic levels of said portion of bits when said reversion detecting means detects that said portion of bits is reversed.

8. A semiconductor memory device having open-bit-lines; comprising:
    a counter for counting a number of bits having one of logic '1' and logic '0' in each of bit-sequences, and enabling a data reversal signal when the number of bits having said one of logic '1' and logic '0' is not in a predetermined range, each of the bit sequences having a fixed number of bits and supplied serially to be written at once in memory cell s selected by a word-line of the semiconductor memory;
    a logic reversing means for reversing logic of a fixed part of each of the bit sequences to be written when the data reversal signal is enabled;
    a reversion recording means for recording whether logic of the fixed part is reversed or not for each of the bit sequences in an additional memory cell which is associated with memory cells where said each of the bit sequences is written; and
    a restoring means for restoring logic of data read out from memory cells where one of the bit sequences are written, by reversing the fixed part of the data when a data restoring signal is enabled, the data restoring signal being enabled by the reversion recording means when the logic of the additional memory cell, associated to the memory cells wherefrom the data is read out, indicates that the logic of the fixed part of the data is reversed.

9. A semiconductor memory as recited in claim 8, said fixed part being odd-numbered bits.

10. A semiconductor memory as recited in claim 8, said fixed part being even-numbered bits.

11. A semiconductor memory device having open-bit-lines comprising:
    memory cells for storing a plurality of bit sequences, each bit sequence composed of a plurality of bits;
    circuit that is disposed in the semiconductor memory device to receive at least one bit sequence and that reverses the logic levels of a portion of bits in the bit sequence when one logic level predominates bits of said bit sequence; and
    a recorder, coupled to an output of said circuit, and recording information corresponding to logic levels of the portion of bits in the bit sequence that have been reversed.

12. A semiconductor memory device as recited in claim 11, wherein charge potential of one side of a pair of open-bit-lines is left at a pre-charged potential when data is written in a memory cell connected to the other side of said pair of open-bit-lines.

13. A semiconductor memory device as recited in claim 11, wherein one logic level is determined to predominate when more than ¾ of bits in the bit sequence have the same logic level.

14. A semiconductor memory device as recited in claim 11, wherein one logic level is discriminated to predominate by counting a number of bits having one of logic '1' and logic '0' in the bit sequence.

15. A semiconductor memory device as recited in claim 11, said portion of bits in the bit sequence being odd-numbered bits.

16. A semiconductor memory device as recited in claim 11, said portion of bits in the bit sequence being even-numbered bits.

17. A semiconductor memory device as recited in claim 11, further comprising:
    a detector for determining whether a portion of bits in a bit sequence is reversed when said bit sequence is read from memory; and
    a restoring circuit, coupled to an output of said detector, and reversing the logic levels of the portion of bits when said detector determines that said portion of bits is stored in memory with reversed logic levels.

* * * * *